United States Patent
Bertrand et al.

(10) Patent No.: US 6,495,460 B1
(45) Date of Patent: Dec. 17, 2002

(54) DUAL LAYER SILICIDE FORMATION USING A TITANIUM BARRIER TO REDUCE SURFACE ROUGHNESS AT SILICIDE/JUNCTION INTERFACE

(75) Inventors: Jacques Bertrand, Capitola, CA (US); George Kluth, Los Gatos, CA (US); Minh Van Ngo, Fremont, CA (US); Christy Mei-Chu Woo, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/901,705

(22) Filed: Jul. 11, 2001

(51) Int. Cl.$^7$ .................. H01L 21/44; H01L 21/4763
(52) U.S. Cl. ................... 438/683; 438/630; 438/649; 438/656
(58) Field of Search ................... 438/682, 683, 438/656, 655, 630, 649, 583; 427/126.6

(56) References Cited

U.S. PATENT DOCUMENTS

| | | | |
|---|---|---|---|
| 5,814,537 A | * 9/1998 | Maa et al. | 148/DIG. 147 |
| 5,994,747 A | * 11/1999 | Wu | 257/344 |
| 5,998,248 A | * 12/1999 | Ma et al. | 438/231 |
| 6,093,628 A | * 7/2000 | Lim et al. | 438/571 |
| 6,303,504 B1 | * 10/2001 | Lin | 438/683 |

OTHER PUBLICATIONS

Setton et al. "Formation of ternary silicide for Ni/Ti/Si (100) and Ni/TiSi2" Journal of Materials Research 4(5), Sep./Oct. 1989, pp. 1218–1226.*

Horache et al. "Ti/Ni bilayers on silicon: sputter–induced intermixing, rapid thermal annealing, and ternary silicide formation" Thin Solid Films 177, 1989, pp. 263–270.*

Mo et al. "Formation and properties of ternary silicide (CoxNi1–x)Si2 thin films" Proceedings of the IEEE 1998 5th International Conference on Solid–State and Integrated Circuit Technology, 1998, pp. 271–274.*

Lauwers et al. Comparative study of Ni–silicide and Co–silicide for sub 0.25 mm technologies, Microelectronic Engineering 50(1–4) pp. 103–106.*

* cited by examiner

*Primary Examiner*—Olik Chaudhuri
*Assistant Examiner*—Erik Kielin

(57) ABSTRACT

A semiconductor device and method for manufacturing the semiconductor device employing mixed metal silicide technology is disclosed. A semiconductor device is provided having a doped silicon region, such as a source/drain. A first metal layer comprising titanium and a second metal layer comprising nickel are deposited over the semiconductor device. The device is subjected to rapid thermal annealing. The resulting device has a mixed metal silicide layer over the doped silicon region, the mixed metal silicide layer and the doped silicon region having smooth interface between them.

19 Claims, 5 Drawing Sheets

DUAL LAYER SILICIDE FORMATION USING A TITANIUM BARRIER TO REDUCE SURFACE ROUGHNESS AT SILICIDE/ JUNCTION INTERFACE

RELATED APPLICATIONS

This application contains subject matter similar to the subject matter disclosed in U.S. patent application Ser. No. 09/729,696, filed on Dec. 6, 2000, and U.S. patent application Ser. No. 09/729,697, filed on Dec. 6, 2000.

FIELD OF THE INVENTION

The present invention relates to semiconductor devices and methods for their manufacture. In particular, the present invention relates to formation of silicide on semiconductor devices with decreased roughness between a doped silicon region and a metal silicide region.

DESCRIPTION OF THE RELATED ART

One of the major goals of integrated circuit design is to produce ever smaller integrated circuits without forfeiting performance. For instance, in designing metal oxide silicon (MOS) stransistors, manufacturing smaller components implies the need to design transistors with shorter gates. When the size of a MOS gate is decreased, it is necessary to decrease the size of the source and drain regions in order to reduce leakage current. However, this reduction in size of source and drain regions creates further problems, as electrical connections between the doped silicon of the source and drain regions and metal interconnects have high characteristic resitivity. Higher source/drain (S/D) resistivity results in slower operation of the semiconductor device. The gains obtained by producing semiconductor devices with reduced dimensions are offset by the decrease in device speed caused by increased source/drain resistivity.

One approach to addressing the problem of high source/drain resistivity is through self-aligned silicide (salicide) technology. Metal silicides have the advantage of having reduced resistivities as compared to doped-silicon alone. In general, this approach entails layering a metal such as nickel directly over the source and drain regions of a MOS device. An annealing process causes the metal to diffuse into the doped-silicon region of the device, where a metal silicide is formed. In the case of nickel, a nickel silicide (NiSi) is the metal silicide that is formed. This silicide layer segregates over the doped silicon S/D region. Unreacted metal is then stripped from the device, for instance with a 4:1 mixture of sulfuric acid ($H_2SO_4$) and hydrogen peroxide ($H_2O_2$), leaving a metal silicide layer over the source/drain regions. The silicide layer presents a much lower interface resistivity with respect to metal interconnects than does the doped silicon source or drain region. For example, $TiSi_2$ has a resistivity of 15–20 $\mu\Omega cm$, $CoSi_2$ has a resistivity of 17–20 $\mu\Omega cm$, and NiSi has a resistivity of 12–15 $\mu\Omega cm$.

A typical prior art method of manufacturing a semiconductor device using silicide technology may be envisioned with reference to FIGS. 1–4. A typical prior art semiconductor device 10 is depicted in FIG. 1. Semiconductor device 10 is a metal oxide semiconductor (MOS) device comprising a silicon substrate 12, a doped silicon source region 14a, a doped silicon drain region 14b, a gate dielectric 18 and a gate electrode 16. Typically, source region 14a and drain region 14b will be doped with the same dopant material, such as As, P, or B, depending on whether the substrate 12 is crystalline silicon, p-doped silicon or n-doped silicon. Semiconductor device 10 also has spacers 180 that provide electrical isolation between the source/drain regions 14a, 14b and the gate electrode 16. The spacers 180 comprise an insulative material, such as silicon nitride (SiN), silicon dioxide ($SiO_2$) or silicon oxynitride (SiON). The spacers 180 are added after source/drain extensions are implanted, and prior to implantation and activation of dopant, such as As, to form the source/drain regions 14a, 14b. The spacers 180 shield the source/drain extensions from further doping during the doping of the source/drain regions 14a, 14b.

As discussed above, a semiconductor device such as MOS device 10 will tend to exhibit relatively high resistivity at source 14a and drain 14b. A typical prior art method of overcoming this problem is through application of silicide technology. A first step of a prior art process employing silicide technology is depicted in FIG. 2. A metal layer 106, such as nickel (Ni), is applied to the surface of silicon substrate 12, source 14a, drain 14b, gate dielectric 18 and gate electrode 16. The device 10 is then subjected to one or more rapid thermal annealing (RTA) steps. After or between the RTA step(s), the unreacted metal layer is removed.

FIG. 3 depicts device 10 after the RTA and unreacted metal removal steps. Source 14a is overlaid with a metal silicide layer 104a, while drain 14b is overlaid with a corresponding metal silicide layer 104b. Gate 16 also has a metal silicide layer 116 formed at its top surface. The metal silicide layers 104a, 104b, 116 provide reduced resistivity to connects (not shown) that will be applied to the metal silicide layers 104a, 104b, 116 of device 10 in later fabrication steps.

However, silicide technology is not without its drawbacks. Among these drawbacks is the tendency of certain silicide layers to form a rough interface between the doped portion of the source/drain regions and their corresponding silicide layers. This has been particularly noted with respect to nickel silicides when used in conjunction with As-doped source/drain regions. FIG. 4 depicts a zoom view of part of a typical prior art device 10 employing silicide technology. The device 10 comprises silicon substrate 12, metal gate dielectric 18, gate electrode 16, doped silicon region 14 and silicide layers 104, 116. The interface between doped silicon region 14 and silicide layer 104 is a rough border 106. Such surface roughness results in greater than optimal resistivity and capacitive reactance, both of which negatively impact device speed. It is therefore desirable to form a smoother border between doped silicon regions and overlying metal silicide layers.

SUMMARY OF THE INVENTION

There is a need for a semiconductor device having a smooth border between doped source/drain regions and overlying metal silicide layers, and a method of forming such a semiconductor device when the silicide includes nickel, and the dopant is arsenic.

This and other needs are met by embodiment of the present invention, which provide a method of fabricating a semiconductor device having a silicide junction having a smooth border between a doped silicon region and a mixed metal silicide region, the method comprising providing a silicon substrate having a doped silicon region disposed thereon, applying a layer of titanium metal over at least the doped silicon region, applying a layer of nickel over at least the titanium layer, subjecting the silicon substrate, doped-silicon region, titanium layer and nickel layer to rapid thermal annealing, and removing the titanium and nickel layers to produce a semiconductor device having a silicide junction having a smooth border between a doped silicon region and a silicide region thereof.

The earlier stated needs are also met by embodiments of the present invention, which provide an integrated circuit device having a silicide junction, having a smooth border between a doped silicon region and a silicide region, comprising: a doped silicon region; a silicide region overlying the doped silicon region, the silicide and doped silicon regions forming a silicide junction having a smooth border between the silicide and doped silicon regions; wherein the silicide region comprises silicon, nickel and titanium atoms.

The foregoing and other features, aspects and advantages of the present invention will become more apparent from the following detailed description of the invention when taken in conjunction with the accompanying drawings.

DETAILED DESCRIPTION OF THE INVENTION

The present invention represents an improvement in the manufacture of semiconductor devices using silicide technology. The present invention uses two layers of silicide-forming metal, a first, thin, Ti layer, and a second, Ni layer, instead of a single silicide-forming metal layer as is known in the prior art. After application of the dual metal layers, the semiconductor device is subjected to rapid thermal annealing (RTA) and further process steps as are known in the art. The present invention uses a dual Ti—Ni layer in place of the prior art single metal layer to produce a semiconductor device that has a smoother surface between the metal silicide layers and their underlying doped silicon S/D eregions. Accordingly, a semiconductor device according to the present invention, which is manufactured by a method according to the present invention, has improved S/D resistivity, faster idevice speed, and the potential for greater device density on semiconductor dice. These and other advantages of the present invention will become apparent with reference to specific embodiments according to the present invention as detailed below.

The present invention can be understood by reference to particular embodiments depicted in FIGS. 5–11. The ordinary artisan will appreciate, however, that other embodiments are possible within the scope of the present description and claims, and are contemplated as being within the scope of the present invention.

Figure 1:
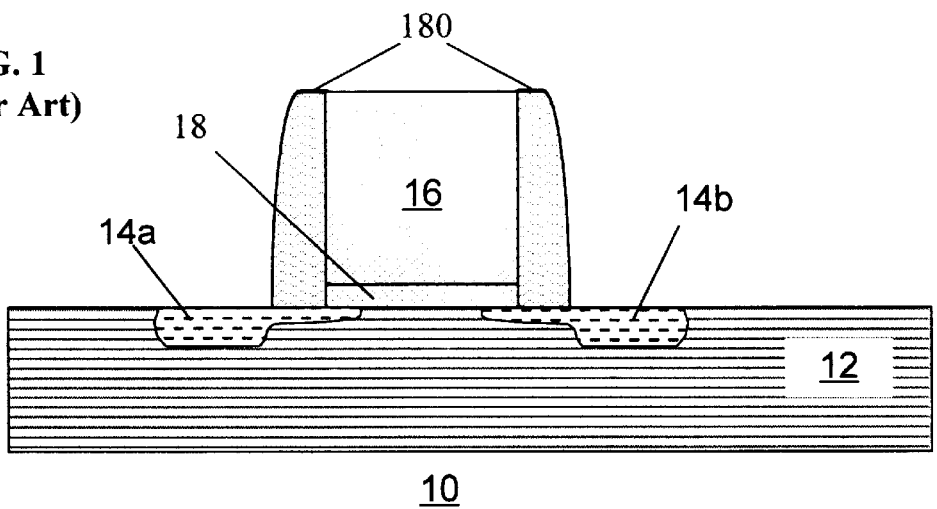
FIGS. 1–3 depict typical steps in a prior art method of fabricating a semiconductor device employing silicide technology.
Figure 2:
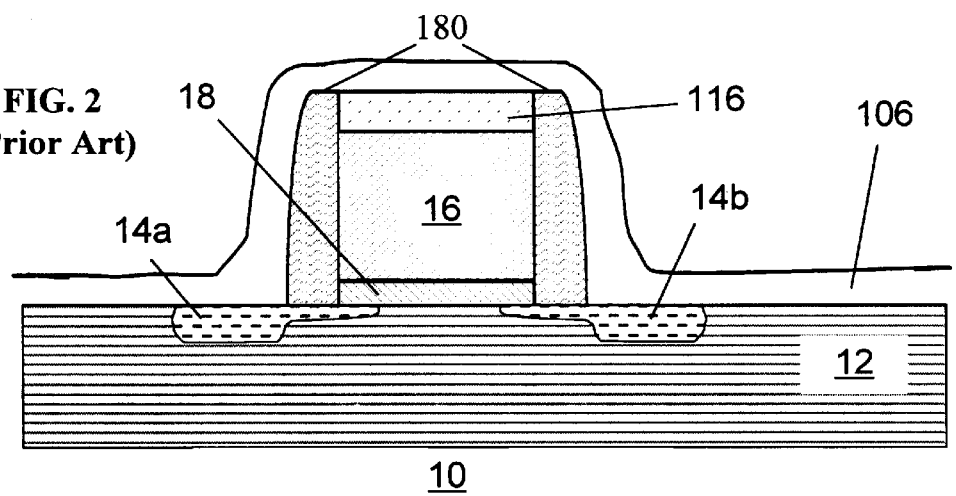
Figure 3:
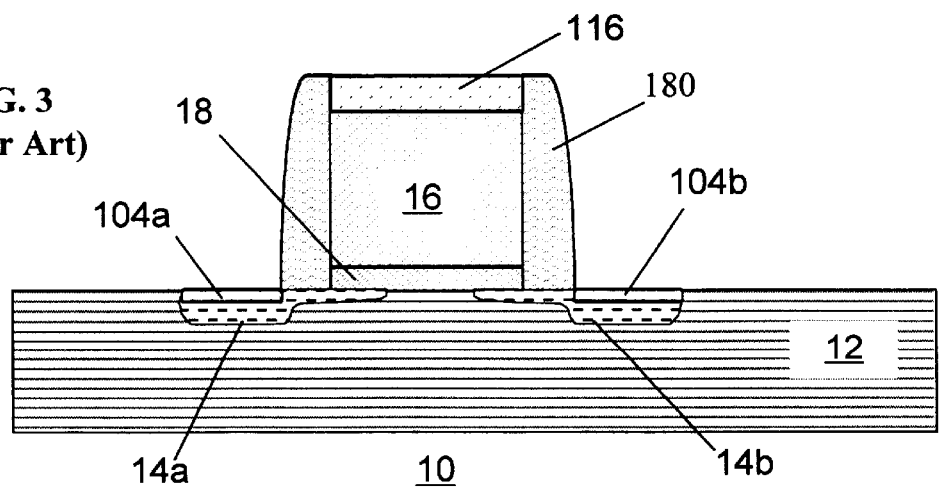
Figure 4:
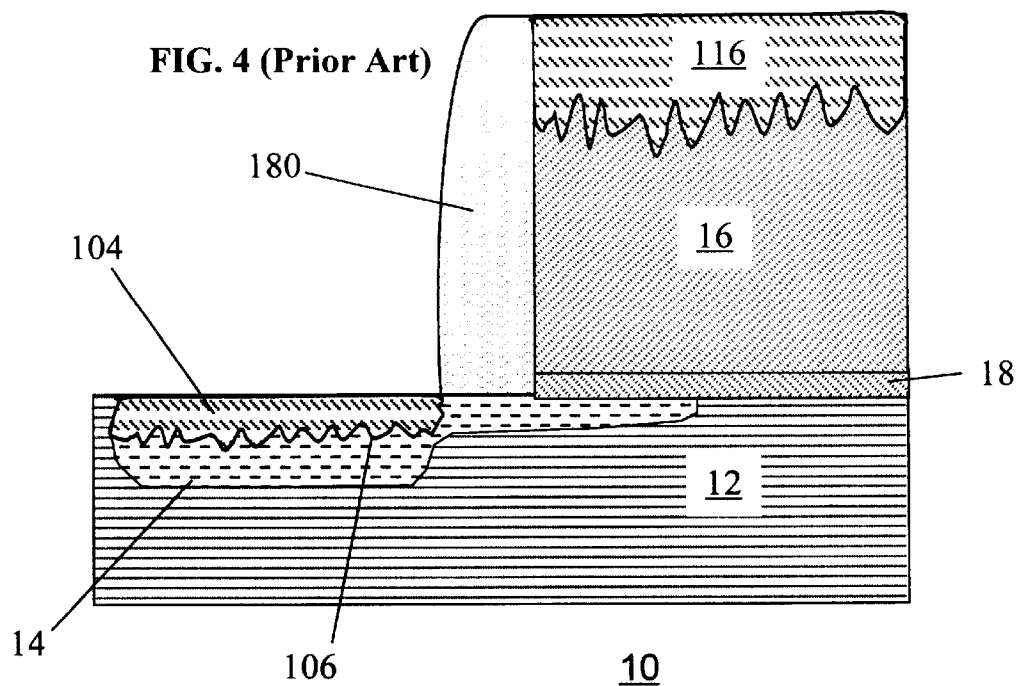
FIG. 4 depicts a typical metal silicide/doped silicon S/D junction having a rough border between the silicide and doped silicon regions.
Figure 5:
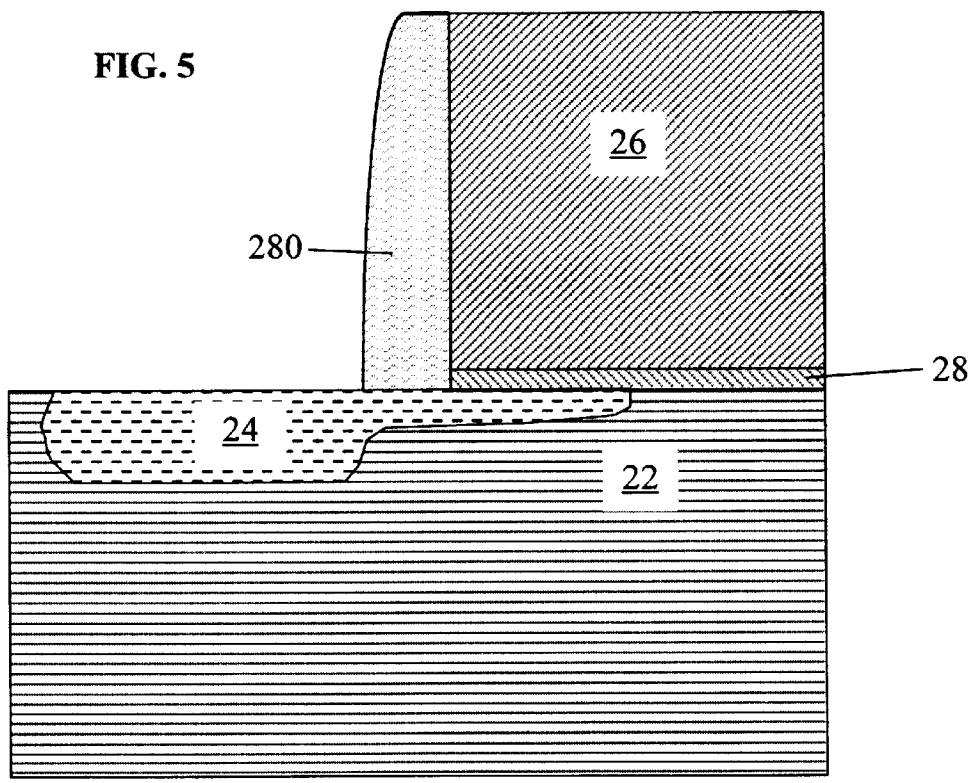
FIGS. 5–9 depict a semiconductor device at various steps in an embodiment of a method of making of a semiconductor device according to the present invention.
Figure 11:
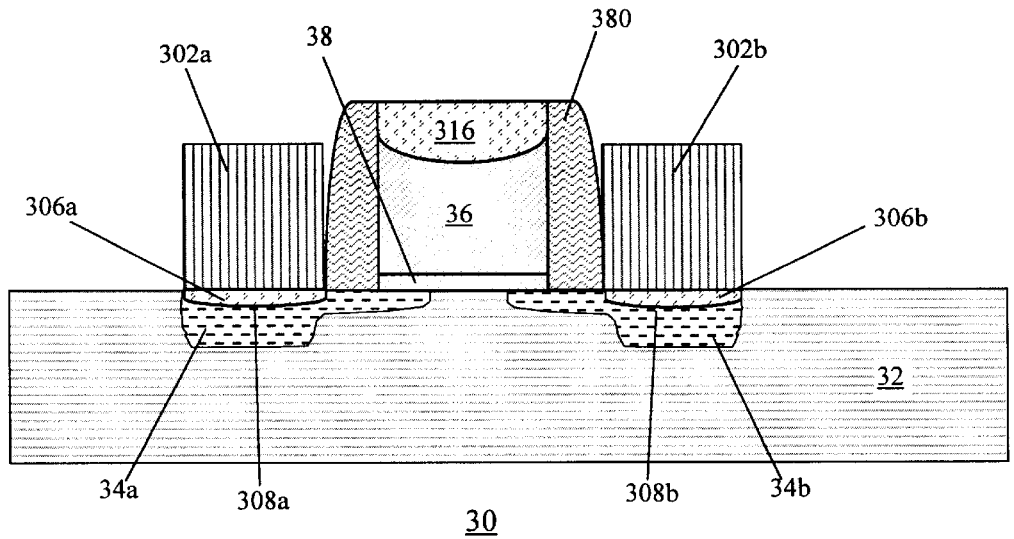
FIG. 11 depicts an embodiment of a semiconductor device according to the present invention, further comprising conductive connects overlying metal silicide layers.

One embodiment according to the present invention is illustrated with reference to a semiconductor device 20 as depicted in FIGS. 5–9. In certain embodiments according to the present invention, semiconductor device 20 is a complementary metal oxide semiconductor (CMOS) transistor, in which case the device 20 depicted in FIGS. 5–9 represents only half of a complete semiconductor device. The skilled artisan will understand that a functional CMOS device will comprise complementary halves represented by device 20. As depicted in FIG. 5, the device 20 comprises a silicon substrate 22, a gate dielectric layer 28, a gate electrode 26, spacer 280, and a doped silicon region 24. In the case of a CMOS device, doped silicon region 24 corresponds to either the source or the drain of the CMOS device, it being understood that from a manufacturing standpoint, the source and drain are schematically equivalent. The semiconductor device 20 is subjected to process steps according to the present invention as depicted in FIGS. 6–9 to produce an improved device 30 as depicted in FIG. 11.

The silicon substrate 22 may be any suitable silicon substrate. In certain embodiments of the present invention, the silicon substrate 22 is a single silicon crystal. In other embodiments according to the present invention, the silicon substrate is a p-doped silicon substrate, an n-doped silicon substrate, or an insulated silicon substrate. Advantageously, the silicon substrate 22 will have formed on it a plurality of semiconductor devices such as MOS transistors, diodes, resistors, capacitors, and their associated connects to form an integrated circuit chip (die).

The gate dielectric layer 28 is advantageously a silicon dioxide layer. The gate dielectric layer 28 is formed by any suitable method of forming a silicon dioxide layer. In some embodiments according to the present invention, the gate dielectric silicon dioxide 28 is formed by local oxidation of silicon (LOCOS). In other embodiments according to the present invention, the gate dielectric layer 28 may be formed by other suitable methods of depositing a silicon dioxide layer, such as chemical vapor deposition (CVD). In still further embodiments according to the present invention, the gate dielectric layer 28 comprises silicon nitride (SiN), which is applied to the silicon substrate 22 by any appropriate method recognized in the art. The gate dielectric 28 is advantageously from about 30 to about 200 Å thick.

The gate electrode 26 is a polysilicon layer formed on top of the gate dielectric 28. The gate electrode 26 is advantageously formed by a chemical vapor deposition (CVD) method. In some embodiments according to the present invention, the gate electrode 26 is a pure polysilicon layer, while in other embodiments according to the present invention, gate electrode 26 is partially or completely doped with n-type or p-type dopants, depending on whether the source/drain dopant is n-type or p-type. Typical dopants for the gate electrode 26 include boron (B) and phosphorous (P).

Spacer 280 comprises an insulating material such as silicon dioxide, silicon nitride, or silicon oxynitride. Spacer 280 provides electrical isolation between gate electrode 26 and doped silicon region 24.

The doped silicon region 24 may be either a source or drain of a MOS device, for example. In some embodiments according to the present invention, the dopant is arsenic (As) or phosphorous (P). In particular embodiments according to the present invention, the dopant is As, which is introduced into the silicon substrate layer at a dosage about $10^{13}$ to about $10^{16}$ ions/cm$^2$ and at an energy of about 10 to about 100 KeV. In certain embodiments according to the present invention, the dopant As is applied at an energy of about 10 to about 30 KeV, at a dosage of about $10^{15}$ to about $10^{16}$ ions/cm$^2$. The dimensions of the doped silicon region 24 vary with application, however in some embodiments of the present invention the doped silicon regions 24 are about 100 to about 1000 Å in depth and about 0.25 to about 0.80 micrometers in width.

As discussed earlier, the formation of NiSi on junctions doped with As normally creates rough silicide/junction interfaces, which can lead to junction leakage. The present invention avoids this rough interface by employing a dual layer silicide technique.

Methods of manufacturing a MOS gate structure, such as depicted in FIG. 5, are well known in the art and the ordinary artisan will appreciate that the device 20 may be produced by any art recognized method. In particular, it is known in the art to use resists, sacrificial oxide layers, and spacers, to assist in the formation of dielectrics, polysilicon, doped polysilicon, doped silicon source/drain regions, etc. It is also known to use etching and layering steps for patterning connects, electrodes, etc. These and other art-recognized process steps may be employed along with a process according to the present invention to produce the semiconductor devices of the present invention.

Figure 6:
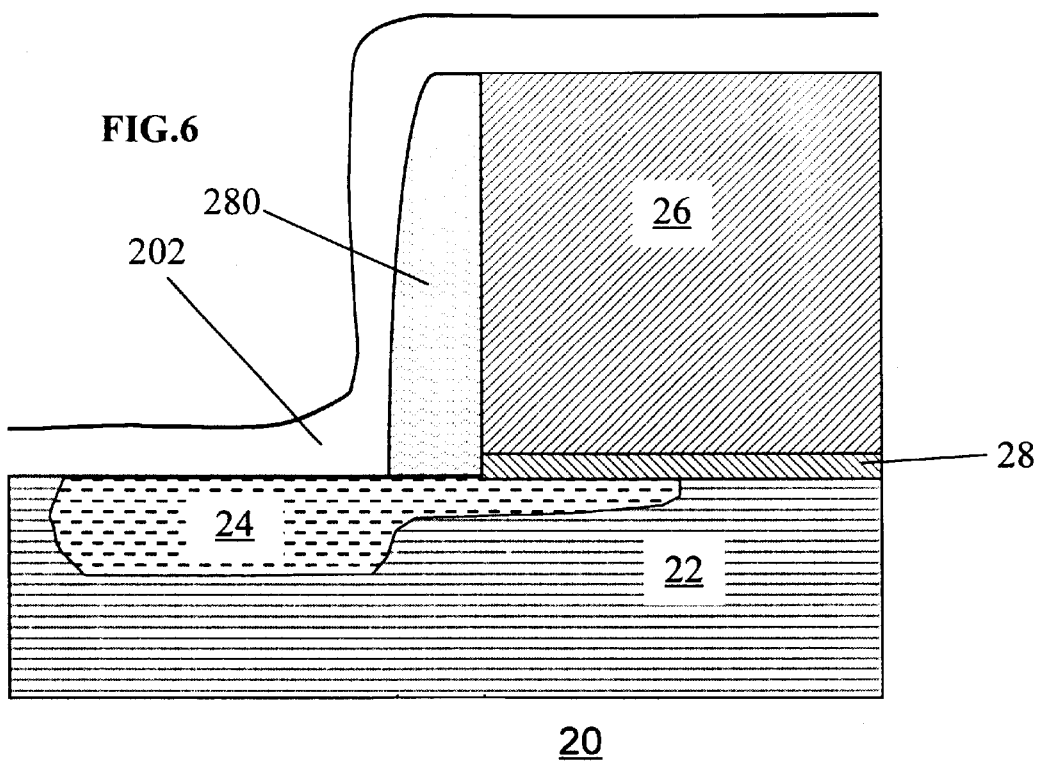

Semiconductor device 20 is first subjected to deposition of a thin barrier layer of a non-nickel metal such as titanium (Ti) metal. FIG. 6 depicts semiconductor device 20 after an titanium metal layer 202 has been deposited thereon. The titanium metal layer 202 covers the silicon substrate layer 22, the doped silicon region 24, the gate dielectric 28, the spacer 280, and the gate electrode 26. The titanium metal layer 202 is advantageously deposited by any method known in the art, such as by chemical vapor deposition (CVD) or sputtering. In particular embodiments according to the present invention, the titanium metal layer 202 is applied by sputtering. A suitable sputtering chamber for Ti deposition is the Endura® VHPPVD® sputtering chamber, which is available from Applied Materials, Inc. of San Jose Calif. The titanium metal layer is formed to a thickness of approximately 10 to 50 angstroms deep, for example.

Although titanium is an exemplary non-nickel metal, other metals may be used without departing from the scope of the present invention. Such metals need to diffuse into silicon to form the corresponding silicide upon exposure to rapid thermal anneal processing.

Figure 7:
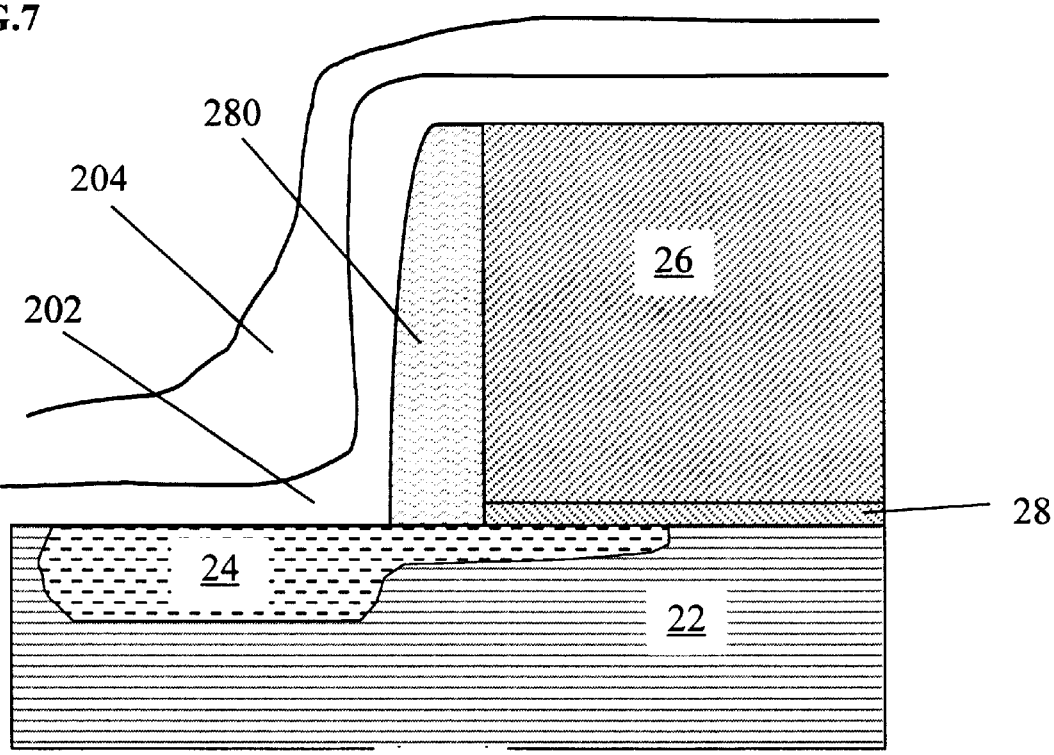

Semiconductor device 20 is next subjected to deposition of a layer of nickel (Ni) metal. FIG. 7 depicts the device 20 having a nickel metal layer 204 over the titanium metal layer 202. The nickel metal layer 204 is deposited over the titanium metal layer 202 in any manner known in the art. In some embodiments of the present invention the nickel metal layer 204 is deposited by chemical vapor deposition (CVD) of the nickel metal, or by sputtering. In particular embodiments according to the present invention, the nickel metal layer 204 is deposited by sputtering in a sputtering chamber such as the Endura® VHPPVD® sputtering chamber, as described above. The thickness is determined based upon the desired silicide thickness or depth and the proportional amount of silicon and metal consumed to form the metal silicide. The metal layer's thickness should be at least the desired silicide depth divided by the ratio of silicon-to-metal consumed to form the silicide. Thus, to form a NiSi region 300 Å in thickness, in which approximately a 1 Å depth of Si is consumed per 1 Å of Ni, the depth of Ni deposited should be approximately 300 Å. Advantageously, the thickness of the nickel metal layer 204 varies from 10 to 400 Å, depending on the depth of the doped silicon region 24. In particular embodiments of the present invention, the nickel metal layer 204 is deposited to a depth of from 100 to 350 Å. In other embodiments according to the present invention, the nickel metal layer is deposited to a depth of from 150 to 300 Å.

Figure 8:
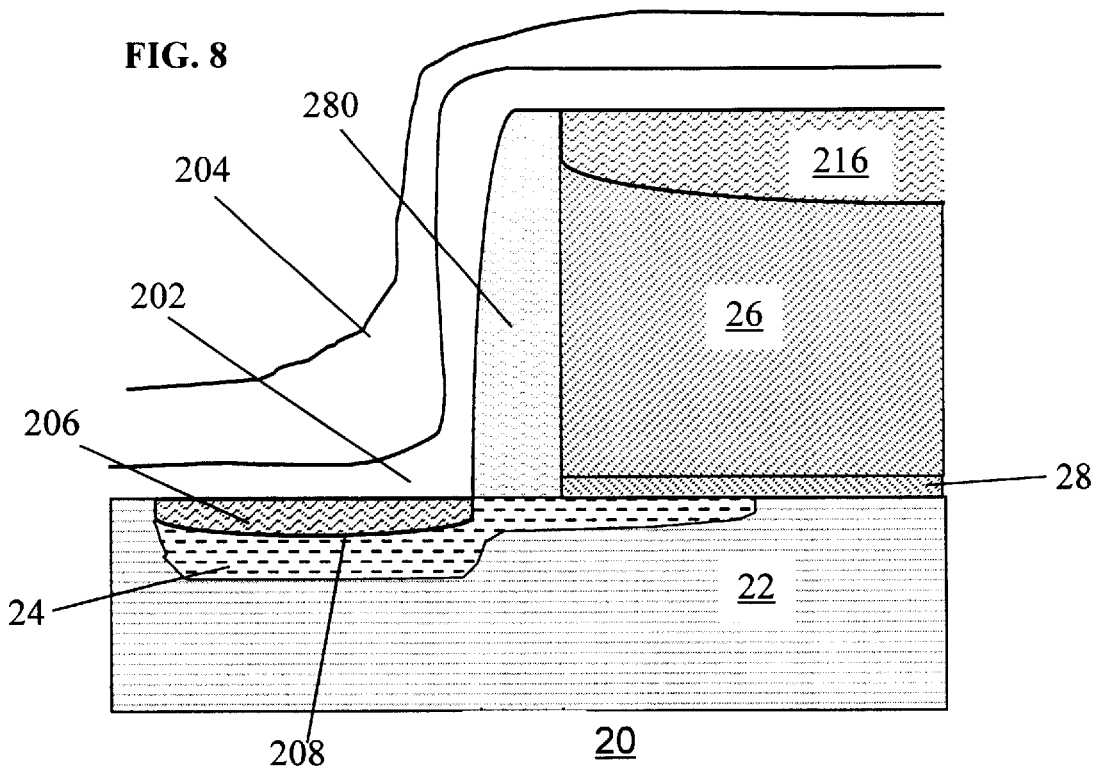

After deposition of the nickel metal layer 204, the device 20 is subjected to a rapid thermal annealing (RTA) step. FIG. 8 depicts the device 20 according to the present invention after a RTA step. During the RTA step, nickel atoms diffuse from the nickel layer 204 across the titanium layer 202 and into the doped silicon region 24, and gate electrode 26, where they react with Si atoms to form nickel silicide (NiSi). At the same time, titanium atoms diffuse from the titanium layer 202 into the doped silicon region 24, where they react with Si atoms to form titanium silicide (TiSi). The titanium silicide and nickel silicide molecules mix together to form a mixed metal silicide region 206 over the doped silicon region 204. The mixed metal silicide region 206 forms a smooth interface 208 with the underlying doped silicon region 24. The smooth interface 208 provides a smoother transition from the doped silicon region 24 to the mixed metal silicide region 206 than is available with prior art methods of manufacturing metal silicide MOS devices that employ As as a dopant and nickel silicide. Additionally, the smooth interface 208 has a reduced surface area. Because this interface is smoother, the junction may be formed with less concern regarding junction leakage caused by a rough interface. Accordingly, it is to be expected that the interface 208 will provide lower resistivity, as well as lower capacitive reactance, than the prior art rough interface. Lower junction resistivity leads to faster device speeds and the potential for greater device density of integrated circuitry dice employing semiconductor devices according to the present invention.

Rapid thermal annealing is advantageously carried out by heating the device 20 to temperatures of about 400° C. to about 700° C. for a period of about 10 seconds to about 1 hour. In particular embodiments according to the present invention, the RTA step is conducted at about 450° C to about 600° C. for about 10 to about 30 seconds in an inert atmosphere, such as under nitrogen ($N_2$) gas. A suitable RTA tool for performing the RTA step is the Centura® rapid thermal processing tool, provided by Applied Materials, Inc. of San Jose, Calif.

Figure 9:
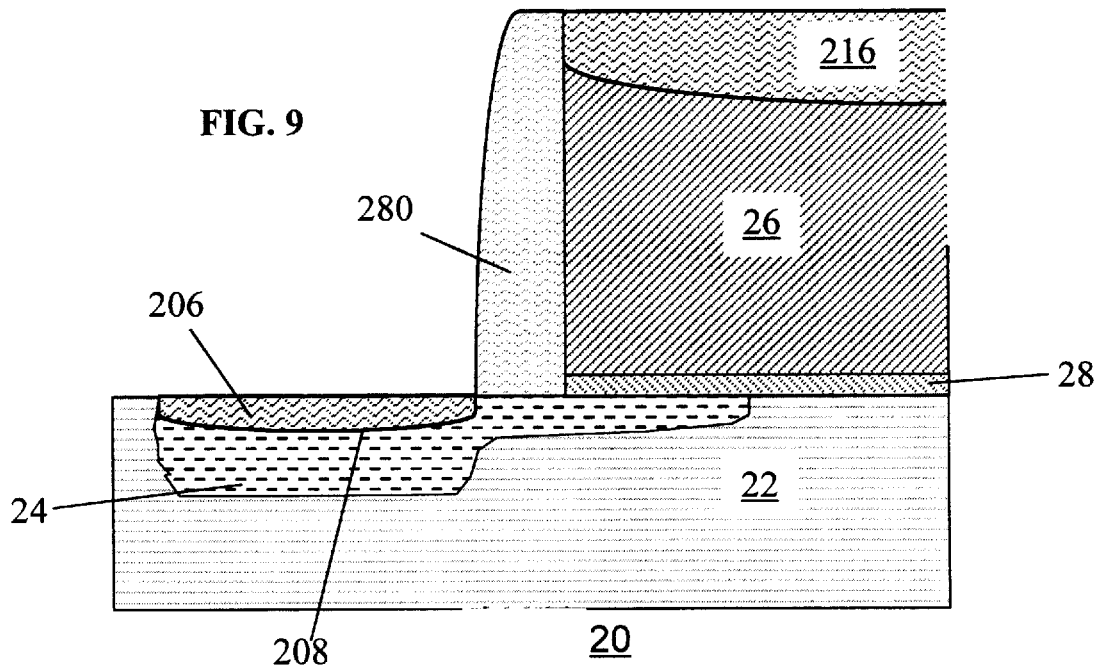

After the rapid thermal annealing step, the unreacted nickel metal layer 204 and titanium metal layer 202 are removed from device 20. The unreacted metal layers are advantageously removed by any suitable method known in the art, such as by chemical etching, chemical mechanical removal, tor stripping. A particularly suitable method for stripping unreacted nickel and titanium is with a 4:1 mixture of sulfuric acid ($H_2SO_4$) and hydrogen peroxide ($H_2O_2$). FIG. 9 depicts a device 20 according to the present invention after removal of the unreacted nickel and unreacted titanium.

Figure 10:
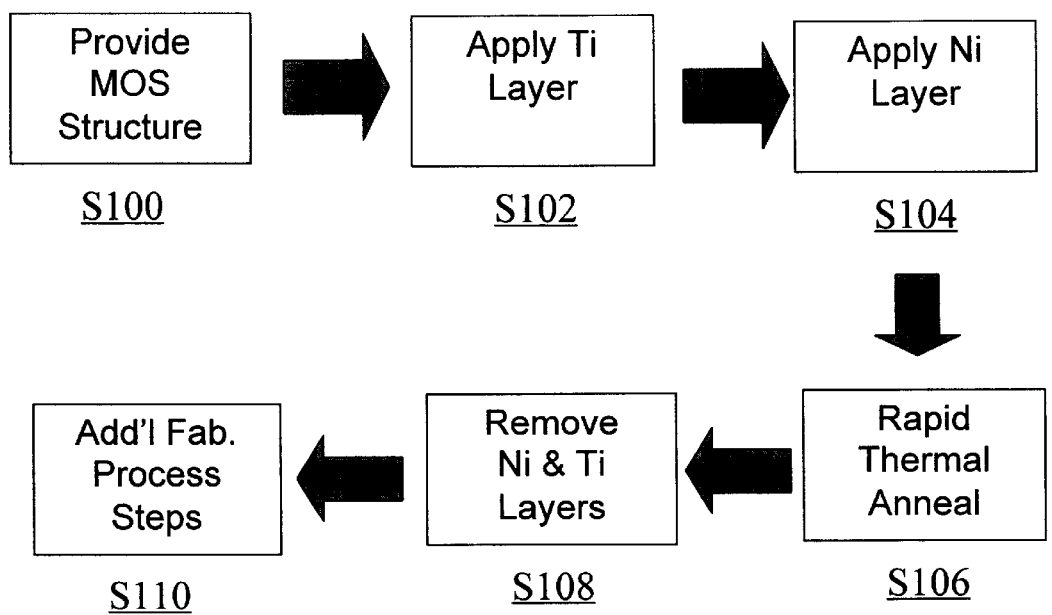
FIG. 10 depicts, in block diagram form, an embodiment of a method of making a semiconductor device according to the present invention.

One embodiment of a process according to the present invention is depicted in FIG. 10. In S100 a semiconductor device, such as an MOS device, is provided on a silicon substrate. Again, the silicon substrate may be any suitable silicon substrate commonly used in the semiconductor arts. In certain embodiments according to the present invention the silicon substrate is a single crystal of silicon. In other embodiments according to the present invention, the silicon substrate is a p-doped silicon substrate, which is doped with a p-type dopant such as, for instance, boron. It is to be understood that, while embodiments of the present invention are described with reference to an MOS device, a method according to the present invention is advantageously applicable to any semiconductor device having a doped silicon region to which a connect is to be formed, and especially those devices in which low barrier resistivity and concomitant increased device speed is desirable. Such devices include semiconductor diodes, resistors, and capacitors formed on a semiconductor substrate, such as a silicon substrate.

In S102, a titanium layer is applied over the semiconductor device. In certain embodiments according to the present invention, the titanium layer is applied over the entire silicon substrate, however, in other embodiments according to the present invention the titanium metal layer is applied over one or more doped silicon regions only. In particular embodiments according to the present invention, the titanium layer is deposited to a depth of 10–50 Å, using the Endura® sputtering chamber as described above.

Following the deposition of titanium in S102, a layer of nickel metal is applied over the silicon substrate in S104. As with the titanium metal layer, the nickel layer is advantageously applied over the entire silicon substrate. However, in some embodiments according to the present invention, the nickel metal layer is applied over doped silicon regions of the semiconductor device only. The nickel layer is generally deposited at least entirely over the titanium layer deposited in S102. In particular embodiments according to the present invention, the nickel layer is deposited over the titanium layer to a depth of 10–500 Å, using the Endura® sputtering chamber as described above.

Following deposition of nickel metal in S104, the semiconductor device is subjected to rapid thermal annealing in S106, in which nickel metal atoms diffuse across the titanium metal layer into the doped silicon region of the semiconductor device while titanium atoms simultaneously diffuse into the doped silicon region. The nickel atoms react with silicon atoms to form nickel silicide (NiSi), while titanium atoms react with silicon atoms to form titanium silicide (TiSi). While not wishing to be bound by theory, it is believed by the inventors that titanium silicide molecules form a slow moving dispersion front as titanium diffuses into the doped silicon region during RTA, behind which diffusion front Ni metal piles up. It is believed that the relatively slow-moving Ti/TiSi diffusion front slows Ni metal diffusion into the underlying doped silicon region. It is further believed that this phenomenon reduces the difference in speed between fast- and slow-diffusing nickel atoms. Furthermore, it is believed that there will also be less difference in diffusion rate between slow- and fast-diffusing TiSi molecules, which are believed to form a relatively large proportion of the boundary between the metal silicide and the doped silicon region. It is believed that these phenomena combine to produce a smoother boundary (or interface) between the mixed metal silicide layer and the underlying doped silicon region than in prior art NiSi/As-dopant active regions.

After the rapid thermal annealing step of S106, the semiconductor device is subjected to one or more steps for removing unreacted nickel and titanium. The unreacted metal layers are advantageously removed by any suitable method, such as by stripping with a 4:1 mixture of sulfuric acid and hydrogen peroxide.

The resulting semiconductor device is then typically subjected to further process steps S110, which include formation of connects, etc. It is especially advantageous to form metal interconnects between semiconductor devices in S110.

FIG. 11 depicts a complete CMOS device according to the present invention. The device 30 comprises a silicon substrate 32, a gate dielectric 38, a gate electrode 36, a spacer 380, source region 34a and drain region 34b. Mixed silicide metal region 306a, comprising NiSi and TiSi molecules, overlies source region 34a, forming silicide interface 308a. Mixed silicide metal region 306b, also comprising NiSi and TiSi$_2$ molecules, overlies drain region 34b, forming interface 308B therewith. Mixed metal silicide/doped silicon region interfaces 308a and 308b are smooth. Gate dielectric 38 comprises, for instance silicon dioxide as described above. Gate electrode 36 comprises polysilicon and in some embodiments of the present invention p-type dopants, such as phosphorous (P) or n-type dopants such as boron (B). Silicon substrate 32 is advantageously a single crystal of silicon, or in some embodiments of the present invention may also comprise a p-type dopant such as P or an n-type dopant such as B.

Spacer 380 comprises an insulating material such as silicon dioxide, silicon nitride, or silicon oxynitride. Spacer 380 provides electrical isolation between gate electrode 36 and doped silicon region 34.

A connect 302a overlies source silicide metal region 306a. Connect 302b overlies drain silicide metal region 306b. Connects 302a and 302b provide electrical connection to other semiconductor devices on silicon substrate 32 (not shown). Connects 302a and 302b may be of any suitable conductive material having the requisite low resistivity for the particular application. Suitable materials for connects 302a, 302b include copper (Cu), silver (Ag), titanium (Ti), tungsten (W), platinum (Pt), gold (Au). In other embodiments according to the invention, connects 302a, 302b are made of conductive polymer materials. The connects 302a, 302b are formed by conventional methods in the art.

The foregoing description of certain embodiments of the present invention illustrates how using a thin titanium metal layer between a layer of nickel and a layer of doped silicon results in a mixed metal silicide region having reduced surface roughness between the mixed metal silicide layer and its adjacent doped silicon region.

A method according to the present invention produces a semiconductor device with improved source/drain resistivity. Lower source/drain resistivity results in faster device speeds. The present invention therefore allows the artisan to take advantage of smaller device dimensions, and a concomitant increase in device density, while not sacrificing, and in fact enhancing, device performance characteristics such as input/output speed.

While specific reference has been made to CMOS semiconductor devices, the ordinary artisan will understand that the present invention is applicable to any semiconductor device having at least one doped silicon region, on which a conductive connect is to be made. Moreover, it is to be understood that several such devices may be manufactured on a single silicon substrate to form an integrated circuit die. Thus, the present invention will find a broad range of applications throughout the semiconductor manufacturing arts.

While this invention has been described in connection with what are presently considered to be the most practical and preferred embodiments, it is to be understood that the invention is not limited to the disclosed embodiments, but, on the contrary, is intended to cover various modifications and equivalent arrangements included within the scope of the appended claims.

What is claimed is:

1. A method of fabricating a semiconductor device having a silicide junction having a smooth interface between a doped silicon region and a mixed metal silicide region comprising:

providing a silicon substrate having a doped silicon region disposed thereon;

applying a layer of titanium metal over at least the doped silicon region;

applying a layer of nickel over at least the titanium layer;

heating the silicon substrate, doped silicon region, titanium layer and nickel layer to form a single mixed silicide layer comprising a mixture of nickel silicide and titanium silicide; and removing unreacted titanium and nickel.

2. A method of claim 1, wherein the titanium layer is 10 to 50 angstroms thick.

3. A method of claim 1, wherein the nickel layer is 20 to 100 angstroms thick.

4. A method of claim 1, wherein the nickel layer is approximately twice as thick as the titanium layer.

5. A method of claim 1, wherein the doped silicon regions are source/drain regions.

6. A method of claim 5, wherein the source/drain regions are As-doped silicon regions.

7. A method of claim 1, wherein the heating is conducted at about 400° C. to about 700° C. for a period of about 10 s to about 1 h.

8. A method of claim 7, wherein heating is conducted at about 450° C. to about 600° C.

9. A method of fabricating a semiconductor device having a silicide junction having a smooth interface between a doped silicon region and a mixed metal silicide region comprising:

providing a silicon substrate having a doped silicon region disposed thereon;

applying a layer of titanium metal, having a thickness of 10 to 50 angstroms, over at least the doped silicon region;

applying a layer of nickel, having a thickness of 20 to 100 angstroms, over at least the titanium layer;

heating the silicon substrate, doped silicon region, titanium layer and nickel layer, at about 450° C. to about 600° C. for about 10 s to about 30 s to form a mixed silicide layer comprising a mixture of nickel silicide and titanium silicide; and removing unreacted titanium and nickel.

10. A method of claim 1, wherein the doped silicon region is doped with $10^{15}$ to $10^{16}$ atoms/cm$^2$ of As.

11. A method of claim 1, wherein the doped silicon region is doped with a dopant, wherein the dopant comprises As applied to the doped silicon region at 10–30 KeV.

12. A method of claim 1, wherein the titanium metal and nickel metal layers are removed by stripping with a 4:1 solution of $H_2SO_4$ and $H_2O_2$.

13. A method of fabricating a semiconductor device comprising:

forming active regions in a silicon substrate by doping the active regions with arsenic;

depositing first and second metal layers on the silicon substrate, the first metal layer comprising nickel and the second metal layer comprising a non-nickel refractory metal;

annealing to form metal silicide in the active regions, the metal silicide comprising a single layer comprising a mixture of nickel silicide and non-nickel refractory metal silicide, and the metal silicide having a smooth interface with the remaining portion of the active regions.

14. A method of claim 13 wherein the second metal layer is 10 to 50 angstroms thick and the first metal layer is 20 to 100 angstroms thick.

15. A method of claim 13 wherein the second metal layer is deposited after the first metal layer.

16. A method of claim 13 wherein the first metal layer is approximately twice as thick as the second metal layer.

17. A method of claim 13, wherein the non-nickel refractory metal is a metal that diffuses into active silicon regions upon annealing.

18. A method of 13 wherein the non-nickel refractory metal is titanium.

19. A method of fabricating a semiconductor device comprising:

forming active regions in a silicon substrate by doping the active regions with arsenic;

depositing first and second metal layers on the silicon substrate, the first metal layer comprising nickel and the second metal layer comprising titanium;

annealing to form metal silicide in the active regions, the metal silicide comprising a mixture of nickel silicide and non-nickel refractory metal silicide, and the metal silicide having a smooth interface with the remaining portion of the active regions; wherein:

the second metal layer is 10 to 50 angstroms thick and the first metal layer is 20 to 100 angstroms thick; and the annealing is conducted at about 700° C. to about 900° C. for a period of about 10 second to about 1 hour.

* * * * *